(12) United States Patent
Szkopek et al.

(10) Patent No.: US 10,739,303 B2
(45) Date of Patent: Aug. 11, 2020

(54) GRAPHENE-BASED SENSOR AND METHOD OF FABRICATING SAME

(71) Applicant: THE ROYAL INSTITUTION FOR THE ADVANCEMENT OF LEARNING / MCGILL UNIVERSITY, Montréal (CA)

(72) Inventors: Thomas Szkopek, Outremont (CA); Ibrahim Fakih, Montreal (CA)

(73) Assignee: THE ROYAL INSTITUTION FOR THE ADVANCEMENT OF LEARNING/MCGILL UNIVERSITY, Montreal (CA)

(*) Notice: Subject to any disclaimer, the term of this patent is extended or adjusted under 35 U.S.C. 154(b) by 0 days.

(21) Appl. No.: 16/163,621

(22) Filed: Oct. 18, 2018

(65) Prior Publication Data

US 2019/0120787 A1 Apr. 25, 2019

Related U.S. Application Data

(60) Provisional application No. 62/574,420, filed on Oct. 19, 2017.

(51) Int. Cl.
*H01L 29/16* (2006.01)
*G01N 27/414* (2006.01)
*C23C 16/26* (2006.01)

(52) U.S. Cl.
CPC ....... *G01N 27/414* (2013.01); *H01L 29/1606* (2013.01); *C23C 16/26* (2013.01)

(58) Field of Classification Search
CPC ..... H01L 2924/13072–13076; H01L 29/1606; G01N 27/414–4148; C23C 16/26
See application file for complete search history.

(56) References Cited

U.S. PATENT DOCUMENTS

2017/0059514 A1* 3/2017 Hoffman ............ G01N 33/5438
2017/0110678 A1* 4/2017 Zang ................. G01N 27/4141

OTHER PUBLICATIONS

Wang, Xinran, Scott M. Tabakman, and Hongjie Dai. "Atomic layer deposition of metal oxides on pristine and functionalized graphene." Journal of the American Chemical Society 130.26 (2008): 8152-8153.
Sabri, S. S., et al. "Graphene field effect transistors with parylene gate dielectric." Applied Physics Letters 95.24 (2009): 242104.

* cited by examiner

*Primary Examiner* — Cuong B Nguyen
(74) *Attorney, Agent, or Firm* — Norton Rose Fulbright Canada LLP; Reno Lessard

(57) ABSTRACT

There is described a sensor for sensing a variable of a sample. The sensor generally has a graphene layer supported by a substrate; a parylene layer coating the graphene layer opposite the substrate; a sensing layer coating the parylene layer opposite the substrate, and being exposable to the sample; and electrical contacts at opposite ends of the graphene layer.

19 Claims, 9 Drawing Sheets

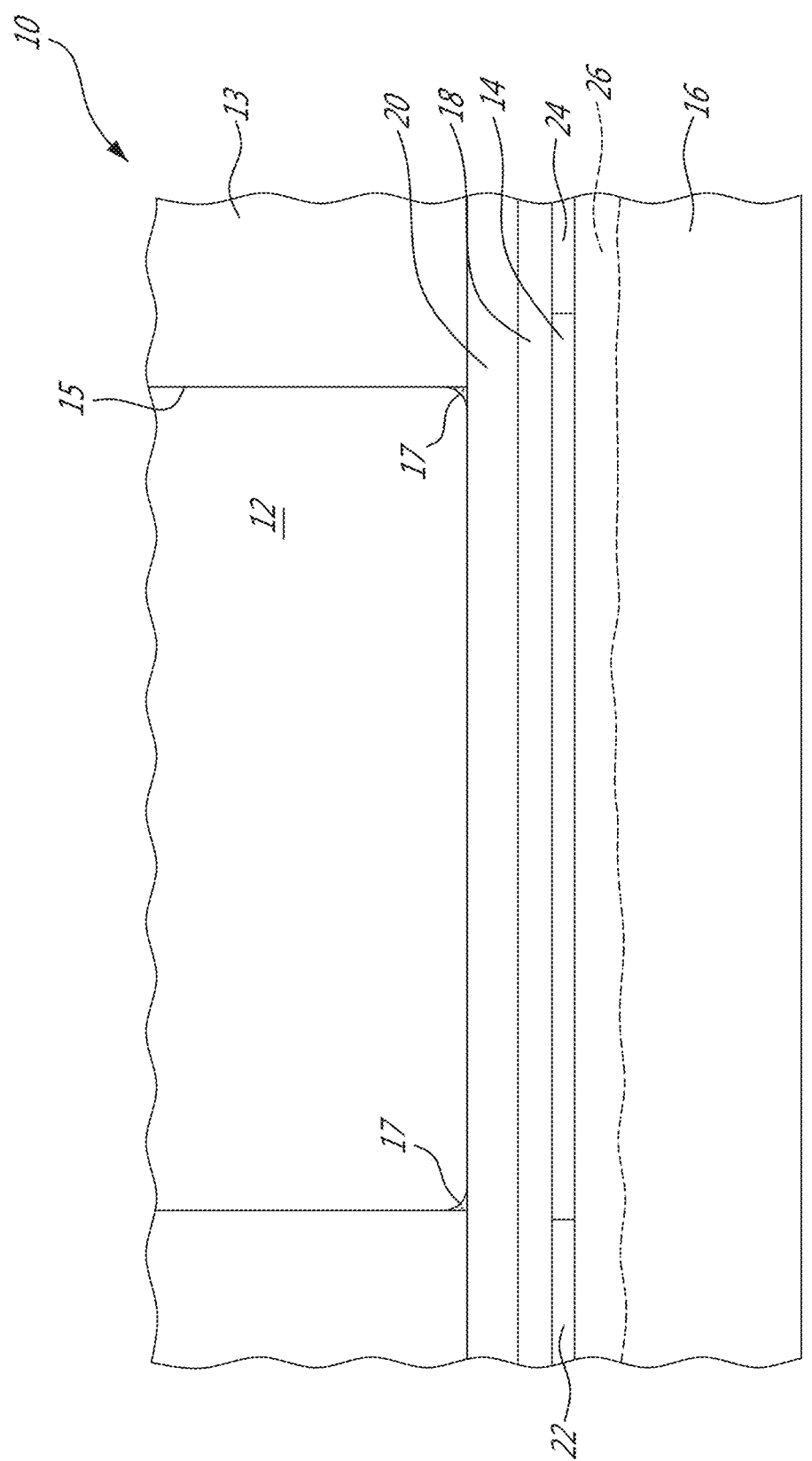

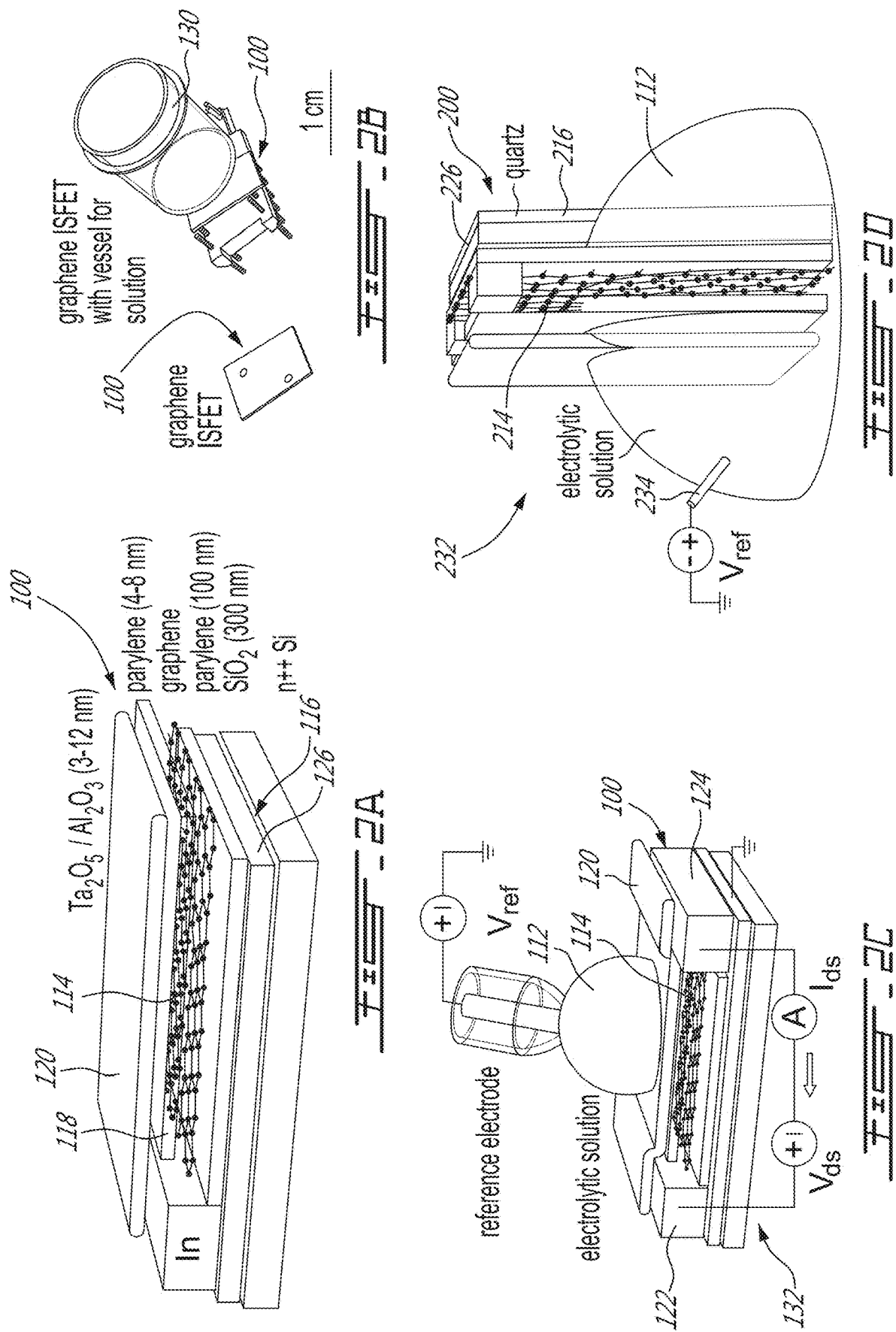

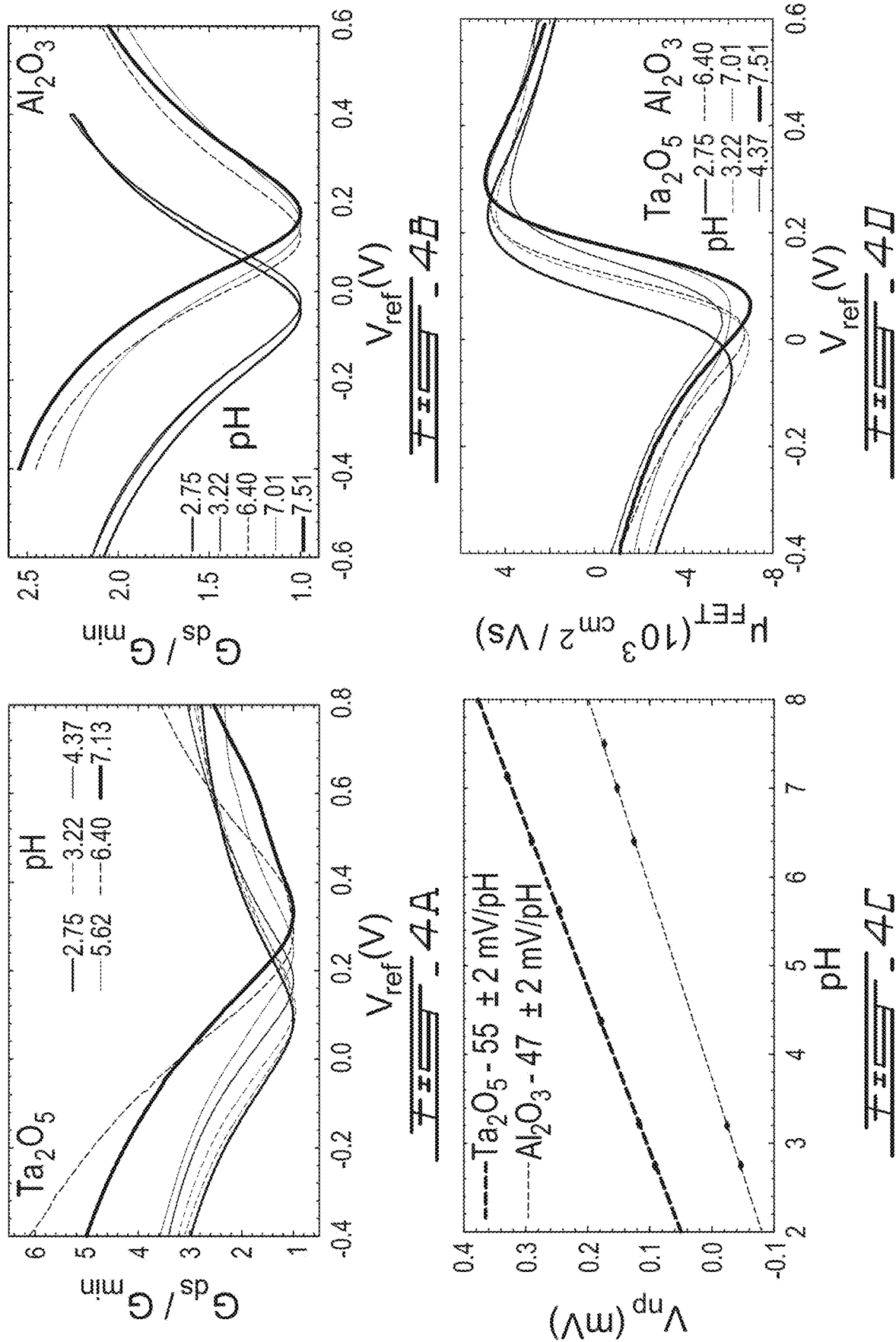

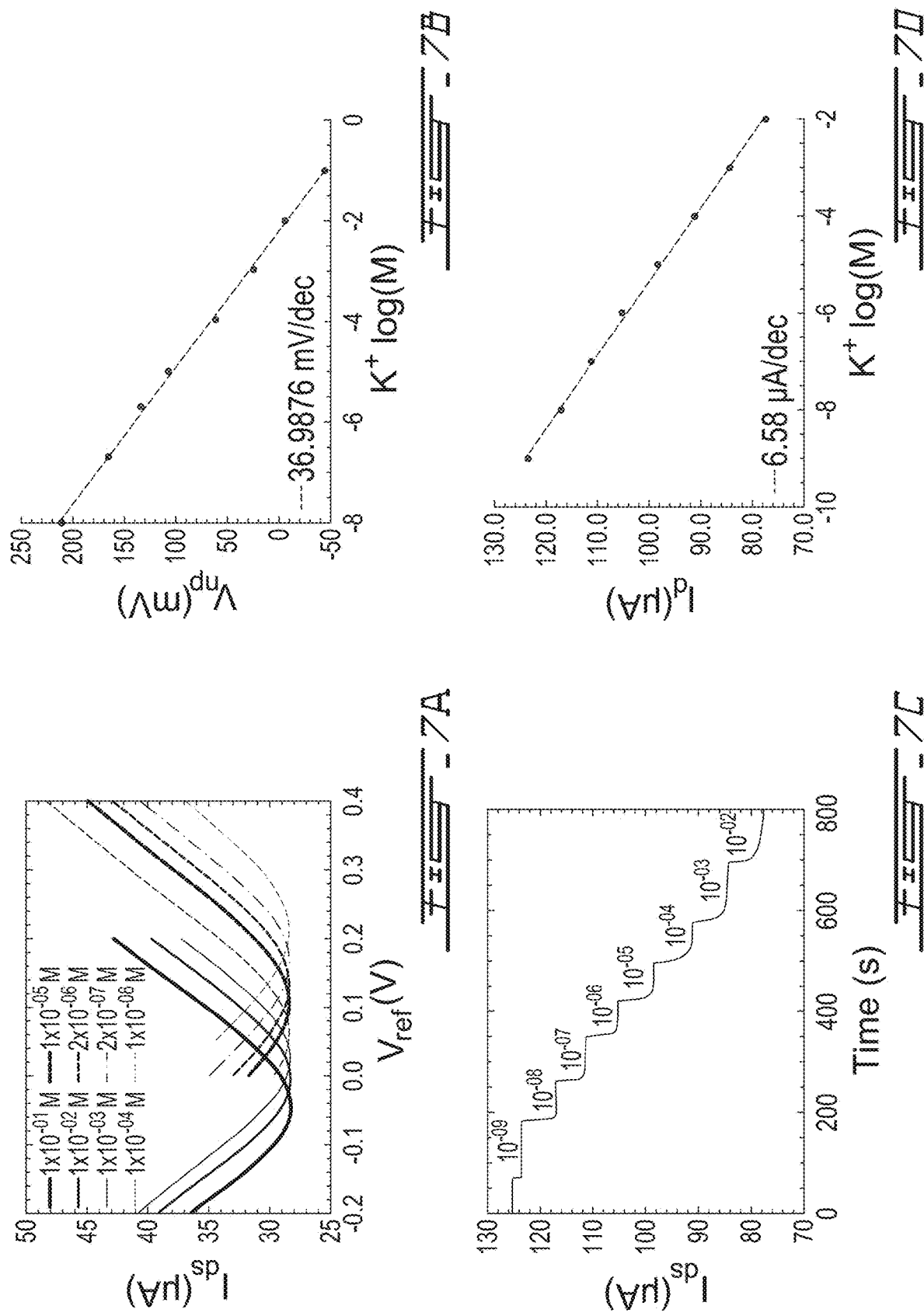

US 10,739,303 B2

GRAPHENE-BASED SENSOR AND METHOD OF FABRICATING SAME

FIELD

The improvements generally relate to sensors and more particularly to graphene-based ion-sensitive field-effect transistor (ISFET) sensors.

BACKGROUND

An ISFET sensor is a field-effect transistor used for measuring ion concentrations in a solution. A typical ISFET sensor generally has a sensing layer (or gate insulator) having a surface in contact with the solution and an opposite surface in contact with a channel disposed between two electrodes, often referred to as the drain and the source, and a reference electrode (or gate electrode) in contact with the solution.

During use of the ISFET sensor, when the ion concentration (such as $H^+$ or $OH^-$) of the solution changes, the current flowing through the channel will change accordingly. Considering the nature of the ISFET, the ion sensitivity of the ISFET sensor will depend on the sensing layer as well as the composition of the channel disposed between the two electrodes. Some existing ISFET sensors harness the valuable electrical properties of graphene by providing the channel in the form of a graphene layer, in attempts to increase the ion sensitivity of the resulting ISFET sensor. However, although existing ISFET sensors are satisfactory to a certain degree, there still remains room for improvement.

SUMMARY

It was found that existing sensors often suffered from the fragility of the graphene layer, and/or from the chemical incompatibility between the sensing layer and the graphene layer, which could result in graphene-based sensors which were impractical and/or inoperable. Accordingly, the inventors found that by protecting the graphene layer with a parylene layer, the parylene layer could protect the graphene layer without significantly impeding the ion sensitivity of the graphene layer. As can be understood, the thickness of the parylene layer of the sensor is thin compared to the thickness of conventional parylene coatings which are generally used for coating electronic devices for water protection purposes.

In accordance with one aspect, there is provided a sensor for sensing a variable of a sample, the sensor comprising: a graphene layer supported by a substrate; a parylene layer coating the graphene layer opposite the substrate; a sensing layer coating the parylene layer opposite the substrate, and being exposable to the sample; and electrical contacts at opposite ends of the graphene layer.

In accordance with another aspect, there is provided a method of fabricating a sensor, the method comprising: depositing a graphene layer on a substrate; depositing electrical contacts at opposite ends of said graphene layer; depositing a parylene layer on said graphene layer, opposite said substrate, for coating said graphene layer; and depositing a sensing layer on said parylene layer, opposite said graphene layer, for coating said parylene layer.

In accordance with another aspect, there is provided a sensor for sensing a variable of a sample, the sensor comprising: a graphene layer supported by a substrate; a hexagonal boron nitride layer coating the graphene layer opposite the substrate; a sensing layer coating the hexagonal boron nitride layer opposite the substrate, and being exposable to the sample; and electrical contacts at opposite ends of the graphene layer.

In accordance with another aspect, there is provided a sensor for sensing a variable of a sample, the sensor comprising: a graphene layer supported by a substrate; a hydrophobic layer (e.g., a parylene layer, a hexagonal boron nitride layer) coating the graphene layer opposite the substrate; a sensing layer coating the hydrophobic layer opposite the substrate, and being exposable to the sample; and electrical contacts at opposite ends of the graphene layer.

Many further features and combinations thereof concerning the present improvements will appear to those skilled in the art following a reading of the instant disclosure.

DESCRIPTION OF THE FIGURES

In the figures,

FIG. 1 is a cross-sectional view of an example of a sensor for sensing a variable of a sample, in accordance with an embodiment;

FIG. 2A is an oblique view of an example of a sensor for sensing pH of a solution, in the form of a graphene ISFET sensor encapsulated with a parylene layer and a sensing layer, in accordance with an embodiment;

FIG. 2B is an image of the graphene ISFET sensor of FIG. 2A, with a plastic vessel glued atop and mounted on a chip carrier ready for measurement;

FIG. 2C is a schematic view of the graphene ISFET sensor of FIG. 2A, showing a measurement circuit for measuring a graphene conductance $G_{ds}$ for solutions having different pH;

FIG. 2D is a schematic view of the graphene ISFET sensor of FIG. 2A, shown submerged in a solution and with a reference electrode regulating the electrolytic potential;

FIG. 4A is a graph showing normalized conductance, $G_{ds}/G_{min}$, versus $V_{ref}$ for a graphene ISFET sensor having a 5-nm thick sensing layer with $Ta_2O_5$ exposed to solutions of different pH;

FIG. 4B is a graph showing normalized conductance, $G_{ds}/G_{min}$, versus $V_{ref}$ for a graphene ISFET sensor having a 3-nm thick sensing layer with $Al_2O_3$ exposed to solutions of different pH;

FIG. 4C is a graph showing changes in $V_{np}$ with solutions of different pH using the graphene ISFET sensors of FIG. 4A and FIG. 4B;

FIG. 4D is a graph showing FET mobility of the graphene ISFET sensor of FIG. 4A exposed to solutions of pH of 2.75, 3.22 and 4.37 and showing FET mobility of the graphene ISFET sensor of FIG. 4B exposed to solutions of pH of 6.40, 7.01 and 7.51;

FIG. 7A is a graph showing current $I_{ds}$ as function of reference voltage $V_{ref}$ as the graphene-based ISFET sensor of FIG. 6A is immersed in solutions having different potassium concentrations;

FIG. 7B is a graph showing neutrality point voltage $V_{np}$ as the graphene-based ISFET sensor of FIG. 6A is immersed in solutions having different potassium concentrations;

FIG. 7C is a graph showing transistor current $I_{ds}$ over time as the graphene-based ISFET sensor of FIG. 6A is immersed successively in solutions having different potassium concentrations;

FIG. 7D is a graph showing the change in transistor current $I_{ds}$ as the graphene-based ISFET sensor of FIG. 6A is immersed in solutions having different potassium concentrations;

DETAILED DESCRIPTION

Figure 3A:
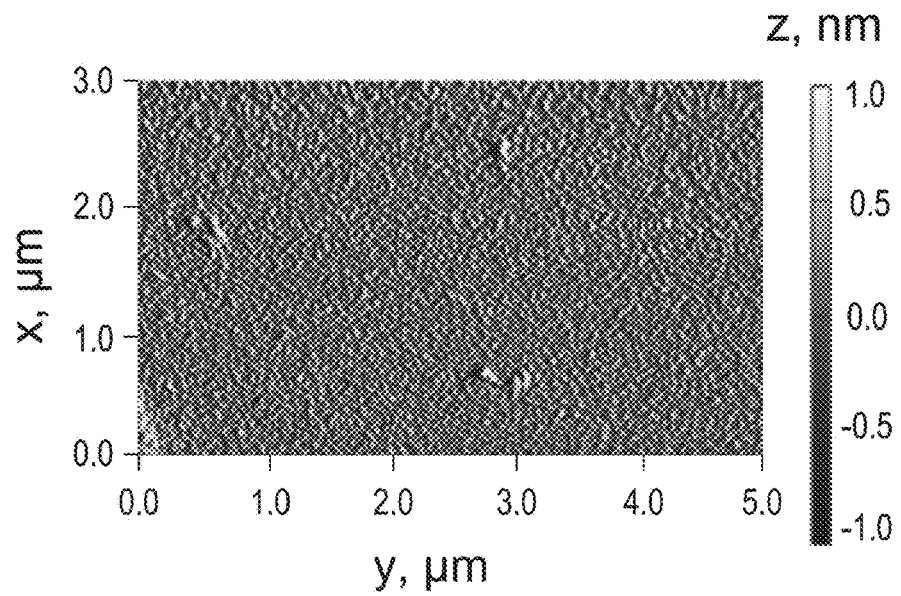
FIG. 3A is an atomic force microscopy image of a parylene layer of the graphene ISFET sensor of FIG. 3A, showing a variation of about ±2 nm in uniformity.

FIG. 1 shows a cross-sectional view of an example of a sensor 10 for sensing a variable of a sample 12, in accordance with an embodiment.

As can be understood, the sample 12 can be provided in the form of a solution in some embodiments. However, the sample 12 can be provided in the form of a gas in some other embodiments.

As depicted, the sensor 10 has a graphene layer 14 supported by a substrate 16, a parylene layer 18 coating the graphene layer 14 opposite the substrate 16, a sensing layer 20 coating the parylene layer 18 opposite the substrate 16, and electrical contacts 22 and 24 at opposite ends of the graphene layer 14. As can be seen, the sensing layer 20 is exposed to the solution 12 in the illustrated embodiment.

The parylene layer 18 generally has a thickness sufficient for protecting the graphene layer 14 without significantly impeding the ion sensitivity of the graphene layer 14. For instance, in some embodiments, the parylene layer 14 has a thickness between 2 and 20 nm, preferably between 2 and 10 nm and most preferably between 4 and 8 nm. However, the parylene layer 14 can have any other suitable thickness.

In this specific example, the substrate 16 has an insulating layer 26 supporting the graphene layer 14. More specifically, in this example, the insulating layer 26 includes an additional parylene layer (referred to herein as "parylene layer 26"). Accordingly, the graphene layer 14 is thus sandwiched between the two parylene layers 18 and 26 in this specific example. In some embodiments, the parylene layer 26 has a thickness between 50 nm and 200 nm, preferably between 75 and 150 nm and most preferably of about 100 nm.

In this embodiment, it was found convenient to provide a printed circuit board 13 having a sensing opening 15. As depicted, at least a portion of the sensing layer 20 is exposed to the sample 12 via the sensing opening 15 of the printed circuit board 13. Still in this embodiment, a seal 17 is provided at the sensing opening 15 so as to prevent sample intrusion, and more specifically, to prevent the sample 12 from contacting the electrical contacts 22 and 24. The seal 17 can include epoxy and/or any other suitable sealant material.

As can be seen in this example, the sensing layer 20 is configured for sensing the pH of the sample 12 in contact therewith. For instance, the sensing layer 20 can be made of one of $Ta_2O_5$ and $Al_2O_3$, as described in further detail in the example herebelow.

However, it is envisaged that other sensing layers comprising other materials can be deposited on the graphene layer 14 without necessarily compromising its electrical properties, for sensing other variables such as concentration and the like.

For instance, $K^+$ and $Na^+$ are alkali ions which can be found in the human body at low concentrations, and Valinomycin and ETH 157 are materials that can be used as sensing layers, respectively, for sensing the presence or concentration of the alkali ions $K^+$ and $Na^+$.

Further, sensing heavy metal ions such as $NH_4^+$, $PO_4^{3-}$, $Cl^-$, $Pb^{2+}$, $Cu^{2+}$, $AG^+$ and $Al^{3+}$ in water treatment applications, which are also found in very low concentrations, can be of interest for ensuring that the water is potable. Some other examples of sensing layers can be used, such as ETH 149 for sensing $Li^+$, Rubidium Ionophore I for sensing $Rb^+$, Cesium Ionophore I for sensing $Cs^+$ and different polydopamine strands for sensing $Fe^{3+}$, $Mn^{3+}$, $Zn^{2+}$ and $Cu^{2+}$.

In addition to ions, the sensor described herein can be used to sense gas concentrations, by using appropriate sensing layers and filters on the graphene layer. Sensing low concentrations (e.g., parts per billion) of water vapor and oxygen levels can be of interest for manufacturing process applications, whereas sensing the concentration of toxic gases such as carbon dioxide, carbon monoxide, nitrogen oxide, ammonia and ozone can be useful for safety purposes in households or other locations.

There is also presented a method of fabricating the sensor 100, in accordance with an embodiment. The method generally has a step of depositing the graphene layer 14 on the substrate 16. In some embodiments, the graphene layer 14 can be deposited using chemical vapor deposition (CVD) technique or any other suitable deposition technique. The method also has a step of depositing the electrical contacts 22 and 24 at opposite ends of the graphene layer 14. This step can involve electron beam evaporation, thermal evaporation, sputtering and similar metal contact deposition techniques. The method also has a step of depositing the parylene layer 18 on the graphene layer 14, opposite the substrate 16, for coating the graphene layer 14. The method also has a step of depositing the sensing layer 20 on the parylene layer 18, opposite the graphene layer 14, for coating the parylene layer 18.

In this specific embodiment, the substrate 16 has the insulating layer 26 that has been deposited on the substrate 16, in which case the step of depositing the graphene layer 14 on the substrate 16 comprises a step of depositing the graphene layer 14 on the insulating layer 26 of the substrate 16. However, in other embodiments, the insulating layer 26 can be omitted.

It is noted that when the sensing layer 20 is provided in the form of an oxide layer, deposition of the oxide layer can be performed using atomic layer deposition or any other suitable deposition technique. In some other embodiments, for instance when the sensing layer 20 is provided in the form of an ionophone layer, deposition of the ionophone layer can be performed using dropcast, spincoat or any other suitable deposition technique.

It is envisaged that the electrical contacts 22 and 24 can be electrically connected to a measurement circuit (see FIG. 2C) and/or to the printed circuit board 13 before or after deposition of the sensing layer 20. For instance, in embodiments where the sensing layer 20 is provided in the form of an oxide layer, the sensing layer 20 may be deposited on the graphene layer 14 prior to the connection of the electrical contacts 22 and 24 with the measurement circuit and/or the printed circuit board 13. However, in embodiments where the sensing layer 20 is provided in the form of an ionophone layer, the sensing layer 20 may be deposited on the graphene layer 14 after the connection of the electrical contacts 22 and 24 with the measurement circuit and/or the printed circuit board 13, through the sensing opening 15 of the printed circuit board 13. It is noted that such electrical connection can be performed using solder balls or other metal bonding techniques.

In these embodiments, the method may additionally has a step of sealing the sensing opening 15 of the printed circuit board 13 to prevent fluid intrusion, which can be convenient in at least some situations.

Example 1—Sensitive Precise pH Measurement with Large-Area Graphene Field-Effect Transistors (ISFET)

Measuring low proton concentrations can be of interest in a wide range of applications, including genome sequencing, food packaging, ocean acidification and the like. Current state of the art pH sensors are potentiometric, either glass- or silicon-based ion sensitive field effect transistors (IS-FETs), which preciseness may be of only ~2 mpH. Alternatives to potentiometric pH sensors such as spectrophotometric pH sensors have been studied with precision and accuracy below 1 mpH, but spectrophotometric pH sensors typically rely on large spectrometers and involve the use of indicator dyes, making them unpractical for applications where analyte quantity is limited, for instance. The limitations in an optimized potentiometric pH sensors' sensitivity, precision and signal to noise ratio (SNR) arise from the combination of a thermodynamically limited response to pH, and noise arising from charge fluctuations in a working electrode. In contrast, limitations in accuracy typically arise from contamination of the liquid junction reference electrode over time. Recent work with ion gel reference electrodes has improved accuracy by at least one order of magnitude. However, limitations with the working electrode remain a major obstacle, and it is therefore important to develop new devices that not only saturate the physical limits of pH sensitivity (defined as the electrical response to pH), but also minimize sources of noise and drift.

Graphene field effect transistors as working electrodes can be attractive candidates for realizing more precise pH detection due to the ideal coupling between mobile charge carriers and surface potential combined with high charge carrier mobility (and thus low Johnson noise) and a relatively inexpensive fabrication process for large-area devices. Analyte selective layers deposited on graphene can transduce chemical adsorption events to modulate the surface potential, resulting in a modulated doping level within the graphene sheet. For the particular case of pH sensing, graphene ion sensitive FETs (ISFETs) make use of sensing layers, typically metal oxides that simultaneously have high intrinsic pH buffering capacities and excellent selectivity, such as tantalum pentoxide $Ta_2O_5$ and aluminum oxide $Al_2O_3$, similar to silicon based ISFETs.

However, depositing high quality thin layers of metal oxide may lead to a chemical incompatibility between the sensing layer and the graphene layer, due to the lack of dangling bonds on the graphene surface. Previous work with graphene ISFETs with a ~2 nm thick $Al_2O_3$ sensing layer deposited via atomic layer deposition (ALD) resulted in incomplete surface coverage and a sensitivity of only 17 mV/pH, well below the typical $Al_2O_3$ limit of 50 mV/pH at room temperature. Previous work with $Ta_2O_5$ on graphene showed that a thickness of ~150 nm was required to ensure optimum oxide quality and complete surface coverage to achieve near Nernstian limited sensitivities of 55 mV/pH. The thick oxide layer resulted in very small coupling capacitance (<0.1 $\mu F/cm^2$) and also degraded the quality of the graphene (carrier mobility values of ~250 $cm^2V^{-1}s^{-1}$).

There are thus needs in decreasing the minimum measurable pH per unit bandwidth in an economical fashion and in minimizing noise to reach the inherent limit imposed by charge fluctuation remains an obstacle. Graphene based ion sensing field effect transistors that saturate the physical limit of sensitivity, defined here as the change in electrical response with respect to pH, can achieve a precision limited by charge fluctuation noise at a sensing layer.

In this example, an optimum working electrode for potentiometric pH sensors is presented. A simple model is provided for the pH detection limit and SNR of a graphene ISFET, from which it is seen that maximizing carrier mobility, sensor active area, and gate capacitance can be the key parameters to reducing the minimum measurable pH change. While these parameters can be key for any ISFET, graphene can be optimal because it can enable large-area devices with high charge carrier mobility using a chemical vapour deposition growth technique that can be economical in comparison with traditional semiconductor growth methods. An experimental demonstration is presented in the following paragraphs. In this example, an optimized large-area graphene ISFET having a graphene layer encapsulated with an ultra-thin layer of parylene C (~4-8 nm), a hydrophobic polymer, to protect the graphene from degradation, improve stability, and promote nucleation of oxide growth during the ALD of both $Al_2O_3$ and $Ta_2O_5$. With only ~3 nm of metal oxide required to ensure high quality and complete coverage, near Nernstian limited sensitivities were observed as well as carrier mobility values of ~7000 $cm^2V^{-1}s^{-1}$, gate capacitances approaching the quantum capacitance limit ~0.6 $\mu F/cm^2$ at 0 V electrolytic gate bias, and the potentiometric pH detection limit was improved to 0.1 mpH in a 60 Hz bandwidth.

The transduction of pH to surface potential $\varphi_0$ is established by the proton density gradient between the bulk solution and the metal oxide sensing surface where pH is buffered. The surface potential then varies with pH at the Nernstian limit $\delta\varphi_0/\delta pH_{bulk}=\ln 10 \cdot k_B T/e$, where e is the electron charge, $k_B$ is Boltzmann's constant and T the absolute temperature. At room temperature $\delta\varphi_0/\delta pH_{bulk}=59$ mV/pH. Sub-Nernstian response can arise from imperfect surface buffering. The ISFET signal current is $i_s=g_m \cdot \delta\varphi_0$, where $g_m$ is the FET transconductance.

The power of the noise current has a contribution intrinsic to the ISFET $\langle i_n^2 \rangle$ and a contribution from the read-out electronics $\langle i_x^2 \rangle$. The noise current intrinsic to the ISFET is dominated by charge fluctuation noise within the sensing layer and is well modeled by $\langle i_n^2 \rangle = (g_m^2 e^2 N_0 / fC^2 A) \cdot \Delta f$, where $N_0$ is the areal density of active sites in the oxide layer contributing to charge fluctuation, C is the capacitance per unit area between channel and electrolyte, A is the active sensing area of the device, f is the measurement frequency and $\Delta f$ is the bandwidth. The signal to noise ratio (SNR) of the ISFET can then be expressed as, $$SNR = \frac{\langle i_s^2 \rangle}{\langle i_n^2 \rangle + \langle i_x^2 \rangle} = \frac{\delta \varphi_o^2}{\frac{e^2 N_0}{fC^2 A} \cdot \Delta f + \frac{\langle i_x^2 \rangle}{g_m^2}}, \quad (1)$$

from which it follows that maximizing FET transconductance $g_m$ can lead to minimizing the effect of the read-out noise $\langle i_x^2 \rangle$ to achieve noise performance intrinsic to the ISFET. As a consequence of $g_m \propto \mu_{FET} \cdot C$, both the field effect mobility $\mu_{FET}$ and device capacitance C can be preferably maximized, without compromising a significant portion of the pH response of the oxide layer. In the limit of large $g_m$, the SNR can reach the intrinsic ISFET limit:

$$SNR \approx \frac{C^2 A}{e^2 N_0} \cdot \frac{f}{\Delta f} \cdot \delta \varphi_o^2, \quad (2)$$

which gives a clear prescription for optimizing SNR. The density $N_0$ is dominated by the intrinsic buffer capacity $\beta_{int}$ of the sensing layer, being typically $\sim 10^{14}$ sites/cm$^2$ for $Al_2O_3$ and $Ta_2O_5$. A large $\beta_{int}$ can lead to achieving a Nernstian response, where in the case of imperfect buffering:

$$\frac{\delta \varphi_o}{\delta pH_{bulk}} = \frac{\ln 10 \cdot k_B T / e}{1 + \ln 10 \cdot \frac{k_B T}{e} \cdot \frac{C_d}{e \beta_{int}}}, \quad (3)$$

where $C_d$ is the differential capacitance of the Guoy-Chapman-Stern double layer ($\sim 17$-$20$ $\mu F/cm^2$). With both the signal and the noise depending on $\beta_{int}$, the SNR can be optimized when $\beta_{int} = \ln 10 \cdot k_B T C_d / e^2 \sim 10^{13}$ sites/cm$^2$, which is a buffering capacity observed in materials such as $SiO_2$. However, selectivity to pH can be greatly compromised with $\beta_{int} < 10^{14}$ sites/cm$^2$, thus setting a lower bound for $\beta_{int}$. Maximizing SNR can thus be achieved by maximizing both the device area A and the channel to analyte capacitance C to minimize charge fluctuation noise. Coupled with the need for large $g_m$ to reach intrinsic noise performance, graphene can be an ideal material system to provide large-area devices with high charge carrier mobility and high capacitive coupling to realize high sensitivity and precision pH measurements.

The capacitance C for a graphene ISFET is a series combination of the differential capacitance $C_d$, the capacitance $C_{ox} = \epsilon A/t$ of the metal oxide of thickness t, and the quantum capacitance $C_q = e^2 \partial n/\partial E_F$ arising from the finite thermodynamic density of states $\partial n/\partial E_F$ within the ISFET channel. The metal oxide capacitance $C_{ox}$ can be maximized by minimizing its thickness, such that the capacitance C is limited by the quantum capacitance $C_q$ of the channel. In the case of graphene, $C_q = e^2 2E_F/\pi(\hbar v_F)^2$ in the extrinsic limit, which is of the order of $\sim 1$ $\mu F/cm^2$ in a typical experimental scenario. The SNR of the ISFET with large $g_m$, Nernstian surface response and quantum capacitance limited coupling becomes, $$SNR = \left( \ln 10 \cdot k_B T \cdot \frac{\partial n}{\partial E_F} \cdot \delta pH \right)^2 \cdot \frac{A}{N_0} \cdot \frac{f}{\Delta f}. \quad (4)$$

To arrive at an estimation of an order of magnitude of the minimum detectable $\delta pH$, where SNR=1, representative device parameters are considered, such as $e_2 \partial n/\partial E_F \sim 1$ $\mu F/cm^2$, $N_0 \sim 10^{14}/cm^2$, $A \sim 0.3$ cm$\times 0.3$ cm, and $\Delta f/f \sim 1$, leading to a minimum detectable $\delta pH \sim 0.1$ mpH.

FIG. 2A shows an oblique view of a graphene ISFET sensor 100 for sensing a variable of a sample, in accordance with an embodiment. In this example, the graphene ISFET sensor 100 has a graphene layer 114 supported by a substrate 116, a parylene layer 118 coating the graphene layer 114 opposite the substrate 116, a sensing layer 120 coating the parylene layer 118 opposite the substrate 116, and being exposable to the sample. In this specific embodiment, the sensing layer 120 comprises a metal oxide such as $Ta_2O_5$ or $Al_2O_3$, and the substrate 116 is a Si—SiO$_2$ substrate.

FIG. 2B is an optical image showing an example of such graphene ISFET sensor 100. As depicted, the graphene ISFET sensor 100 has a plastic vessel 130 glued atop the graphene ISFET sensor 100 and mounted on a chip carrier ready for measurement.

FIG. 2C shows a schematic view of a measurement circuit 132 connected to electrical contacts 122 and 124 of the graphene layer 114 of the graphene ISFET sensor 100 of FIG. 2A. As shown in this example, the graphene ISFET sensor 100 is shown during measurement of a variable (e.g., pH) of a solution 112. Of interest in this example is the sensing layer 120 which extends over and cover the contacts 122 and 124.

More specifically, the measurement circuit 132 is used in this example for measuring the graphene conductance $G_{ds}$ for different pH solutions, where $I_{ds}$ was monitored at a constant bias $V_{ds}$, while the electrolytic potential was varied through the reference electrode $V_{ref}$.

FIG. 2D is a schematic view of an example of a graphene ISFET sensor 200 having a quartz substrate 216. As illustrated, the graphene ISFET sensor 200 is mostly submerged in a solution 212, and the measurement circuit 232 has a reference electrode 234 in contact with the solution 212 for regulating its electrolytic potential.

The ISFET sensors 100 and 200 shown in FIGS. 2A-D incorporate graphene monolayers 114 and 214 grown on copper foils by chemical vapor deposition on respective ones of the substrates 116 and 216. Two different 1 cm×1 cm square substrates were used for the ISFET sensors 100. In the ISFET sensor 100, the substrate 116 has n$^{++}$ doped silicon with 300 nm of dry thermal oxide and 100 nm of parylene C as the insulating layer 126. The insulating layer 126 was deposited onto the substrate 116 at room temperature by evaporating a dimer at 650° C. After transferring the graphene layer 114, indium was used as source and drain contacts 122 and 124. A thin parylene C layer 118, between 4 to 8 nm, was then grown on the graphene layer 114. The thickness of the parylene layer 118 was measured by spectroscopic ellipsometry. In the ISFET sensor 200, the substrate 216 has a single crystal quartz with 100 nm of parylene C as the insulating layer 216.

Figure 3B:
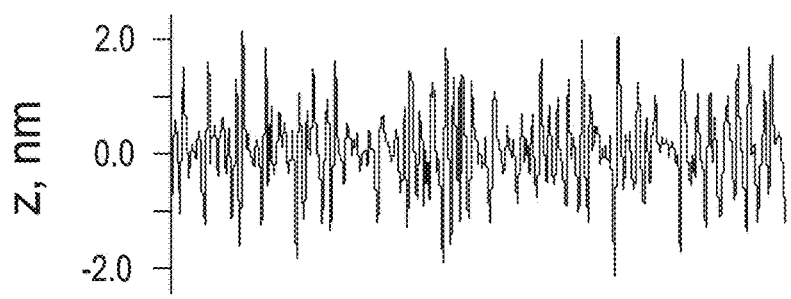
FIG. 3B is a graph showing the variation of uniformity of the parylene layer of the graphene ISFET sensor of FIG. 2A.
Figure 3C:
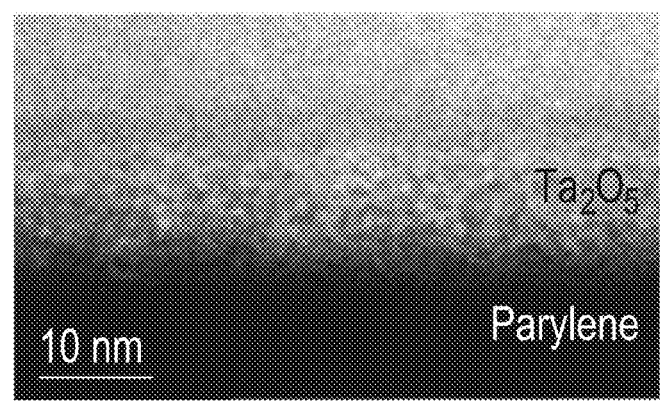
FIG. 3C is a high angle annular dark field (HAADF) image of a sensing layer and of a parylene layer of the graphene ISFET sensor of FIG. 2A.
Figure 3D:
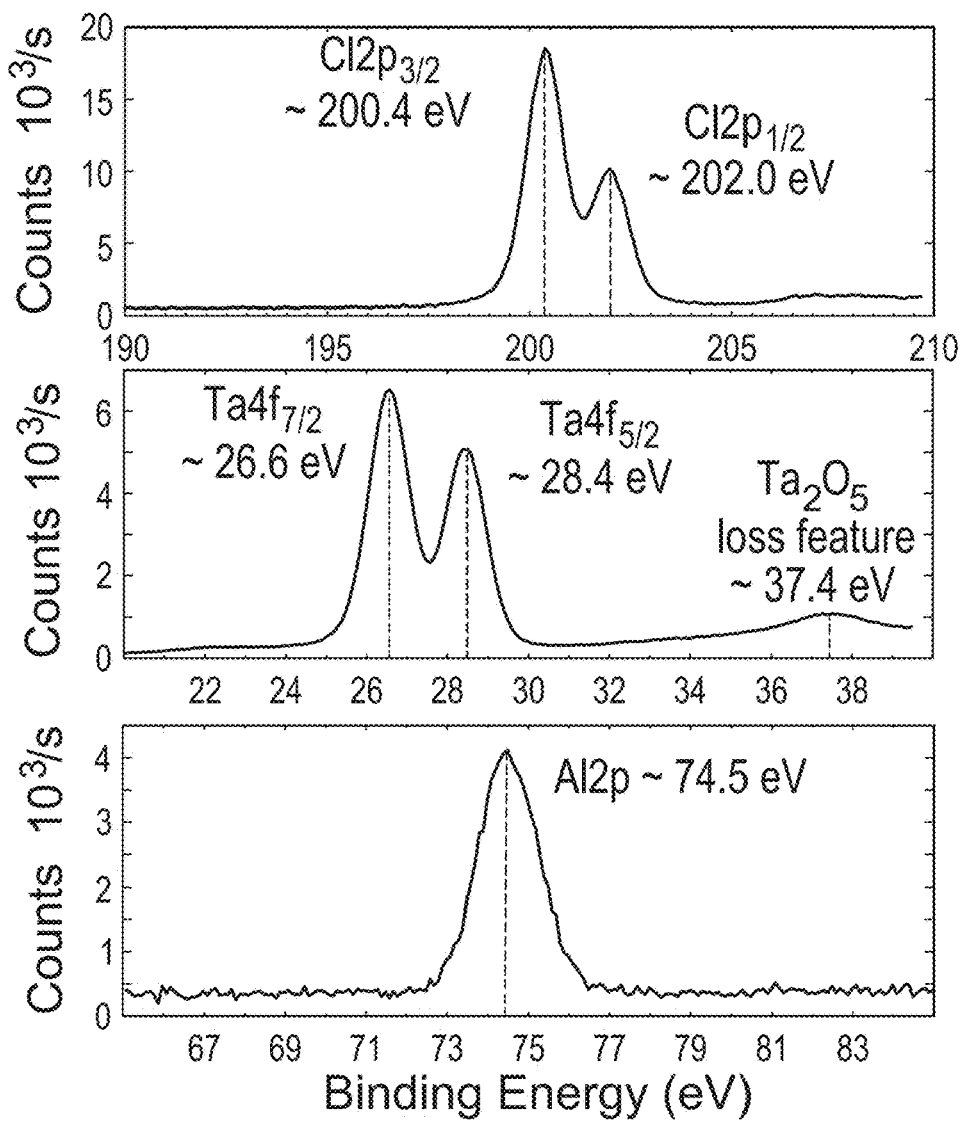
FIG. 3D includes graphs showing binding energy peaks of chlorine in the parylene layer of the graphene ISFET sensor of FIG. 2A.
Figure 3E:
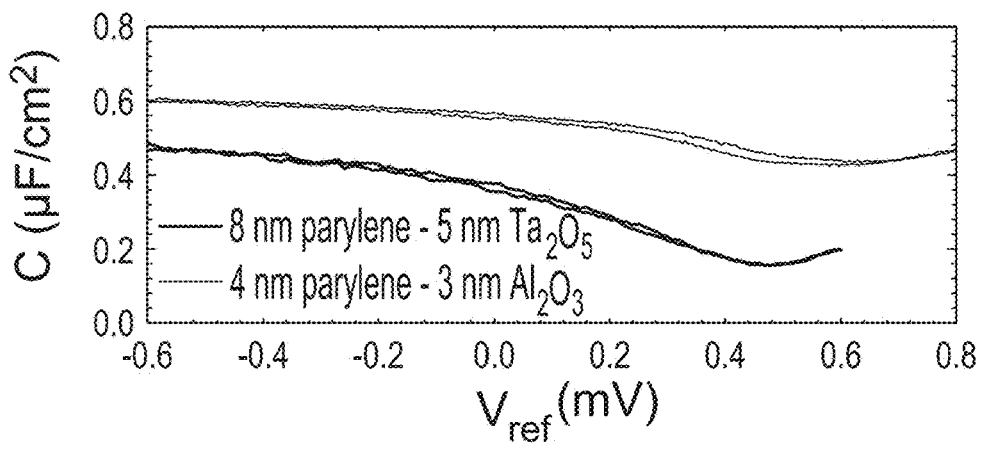
FIG. 3E is a graph showing top gate capacitance measurement of two different graphene ISFET sensors.

FIGS. 3A-B show atomic force microscopy image of a 4 nm parylene C layer on a Si substrate with around ±2 nm variation in uniformity. FIG. 3C shows HAADF image of $Ta_2O_5$ ISFET cross-section. The monolayer graphene cannot be seen in this image due to the parylene encapsulation. The two layers of parylene appear as one, and are very dark in color. The $Ta_2O_5$ layer is bright and is 12 nm for this particular device. FIG. 3D shows binding energy peaks of chlorine in parylene C, tantalum in $Ta_2O_5$ and aluminum in $Al_2O_3$ grown on graphene and measured using x-ray photoelectron spectroscopy. The binding energy peaks are similar to reported values in literature. FIG. 3E shows top gate capacitance measurement of two different graphene ISFETs. One ISFET had 4 nm of parylene and 3 nm of $Al_2O_3$ while the other had 8 nm of parylene and 5 nm of $Ta_2O_5$. Due to the thicker stack, the $Ta_2O_5$ ISFET has lower capacitance, but better modulation.

The uniformity of the ultra-thin layer was measured with atomic force microscopy (AFM). The quality of the polymer was confirmed via x-ray photoelectron spectroscopy (XPS), where the measured characteristic Cl2p peaks matched those reported in literature at ~200.4 eV and ~202.0 eV (as shown in FIG. 3D).

Thin layers of metal oxide (3-12 nm), either $Ta_2O_5$ or $Al_2O_3$, were grown on the parylene by ALD at a substrate temperature of 175° C. with complete coverage. The mechanism behind ALD of stoichiometric metal oxides on polymers is an active area of research. The quality of both materials was also confirmed via XPS. Two peaks, $Ta4f_{5/2}$ and $Ta4f_{7/2}$, were measured to be at ~26.6 and 28.4 eV respectively, matching the reported average values found in literature. The measured Al2p binding energy peak at 74.5 eV also matching that in reported literature. A high angle annular dark field (HAADF) image of a $Ta_2O_5$ ISFET cross-section was also taken with a scanning transmission electron microscope (see FIG. 3C). The monolayer graphene cannot be distinguished within the parylene stack (dark region). The $Ta_2O_5$ layer (bright region) is ~12 nm for this particular device. The ISFETs with a $Si/SiO_2$ substrate had plastic vessels glued atop to contain 2 mL of electrolytic buffer solution interacting with a 0.09 $cm^2$ section of graphene. The ISFETs on quartz were immersed directly in solution, as shown in FIG. 2D.

All buffer solutions used in the experiments presented in this example were 20 mM sodium phosphate based purchased from Sigma Aldrich. Solutions above pH 8.5 from Sigma Aldrich were hydroxide based and were corrosive and damaged both the sensing layer and the graphene layer. A Thermofisher Orion 3 pH meter was used to verify the pH of all test analytes before the experiments, and the devices were rinsed with de-ionized water between measurements to avoid cross-contamination.

The ISFET gate capacitance between analyte and graphene channel was measured using a three electrode geometry as previously reported. A lock-in amplifier (SRS, SR-124) is used to source an AC voltage at a frequency $\omega/2\pi=13$ Hz super-posed with a 0.1 V dc bias to a platinum counter electrode immersed in an electrolytic buffer solution while measuring the ac current flowing through one of the graphene contacts and monitoring the electrolyte potential $V_{ref}$ with a reference electrode (RE, MF-2078, BASi with 3M NaCl filling electrolyte). The electrode was routinely cleaned and stored in NaCl to avoid any contamination. FIG. 3E shows the measured capacitance of two different graphene based ISFETs with a pH 4.37 sodium phosphate buffer solution. One ISFET had 4 nm of parylene and 3 nm of $Al_2O_3$ as a gate dielectric while the other ISFET had an 8 nm layer of parylene and 5 nm layer of $Ta_2O_5$. The characteristic dip in capacitance is a result of the quantum capacitance minimum at charge neutrality. At a 0V electrolytic gate bias $V_{ref}$, the measured capacitance C~0.6 $\mu F/cm^2$ for the $Al_2O_3$ ISFET and ~0.4 $\mu F/cm^2$ for the $Ta_2O_5$ ISFET, in good agreement with the calculated values using the measured thickness of the dielectric layers. Parylene's relatively low dielectric constant of $\epsilon_r=3.15$ can lead to a significant difference between the two ISFETs, and while the thicker parylene layer for the $Ta_2O_5$ ISFET reduces the total capacitance of the device, the graphene layer is better protected during the ALD process. However, other processes can be used.

The graphene conductance $G_{ds}=I_{ds}/V_{ds}$ was also measured versus electrolytic gate potential $V_{ref}$ regulated through the Ag/AgCl reference electrode. The drain-source current $I_{ds}$ of the graphene ISFET was measured with a semiconductor parameter analyzer (Agilent 1500B) at a constant bias $V_{ds}=100$ mV with a swept electrolyte potential $V_{ref}$. The range of $V_{ref}$ was controlled to prevent the electrolysis of the buffer solution and limit the current through the electrolytic gate to no more than 0.5% of the measured $I_{ds}$. Forward and backward sweeps of $V_{ref}$ were taken to study the stability and hysteresis of the ISFETs. A representative sequence of measurements for graphene ISFETs, one with 5 nm of $Ta_2O_5$ and another with 3 nm $Al_2O_3$ sensing layers, for different pH buffer solutions are shown in FIGS. 4A-B, where the forward and backward sweeps are shown only for pH=3.22 buffer solution for clarity. It is important to note that the choice of substrate, whether quartz or $Si/SiO_2$, had no observable effect on the pH sensitivity of the ISFET.

FIG. 4A shows the normalized conductance, $G_{ds}/G_{min}$, of 5 nm $Ta_2O_5$ ISFET versus $V_{ref}$, for different pH solutions. Both forward and backward sweeps are shown for pH 3.22 to demonstrate the limited hysteresis of the ISFET. FIG. 4B shows the normalized conductance, $G_{ds}/G_{min}$, of a 3 nm $Al_2O_3$ ISFET versus $V_{ref}$, for different pH solutions. Both forward and backward sweeps are plotted for pH=3.22 to demonstrate the limited hysteresis of the ISFET. FIG. 4C shows the changes in $V_{np}$ with different pH solutions are plotted for both $Al_2O_3$ and $Ta_2O_5$ ISFETs. A parabolic fit was used to determine the minimum point of conduction and its corresponding $V_{np}$. A near Nernstian response of 55±2 mV/pH is observed across the pH range tested for the $Ta_2O_5$ ISFET, while 47±2 mV/pH for the $Al_2O_3$ ISFET. FIG. 4D shows FET mobility of the 5 nm $Ta_2O_5$ ISFET for pH solutions of 2.75, 3.22 and 4.37 as well as for a 3 nm $Al_2O_3$ ISFET for pH solutions of 6.40, 7.01 and 7.51. Peak mobility values of ~7,000 $cm^2V^{-1}$ $s^{-1}$ were observed for the devices.

At increasing analyte pH, an increase in the potential was found required to reach the point of net charge neutrality $V_{np}$ where the conductance $G_{ds}$ is minimal. A parabolic fit was used to find the potential $V_{np}$ of minimum conductance at each pH, with the resulting dependence on pH plotted in FIG. 4C. A line of best fit is used to calculate the overall sensitivity of our devices. The effects of hysteresis on $V_{np}$ are accounted for in our uncertainty calculations. For the $Al_2O_3$ graphene ISFETs, a sensitivity of ~47±2 mV/pH as measured, near its empirical limit, and near Nernstian sensitivity of ~55±2 mV/pH for $Ta_2O_5$ graphene ISFETs. Significant transconductance was also observed in the graphene ISFETs, with at least 3 fold modulation of $G_{ds}$ for $Ta_2O_5$ ISFETs and 2 fold modulation for $Al_2O_3$ ISFETs. Of interest, the parylene encapsulation can provide remarkable stability with little hysteresis as is evident in the forward and backward sweeps for pH=3.22 for both the $Ta_2O_5$ and $Al_2O_3$ ISFETs shown in FIGS. 4A-B. From the capacitance and conductance measurements conducted, the field effect mobility $\mu FET=(L/W)\cdot(\partial G_{ds}/\partial(CV_{ref}))$ of the graphene ISFETs was determined. Peak mobility as high as ~7000 cm$^2$/Vs, as shown in FIG. 4D was observed, indicating that the high electronic quality of the graphene is preserved during ISFET fabrication.

Figure 5A:
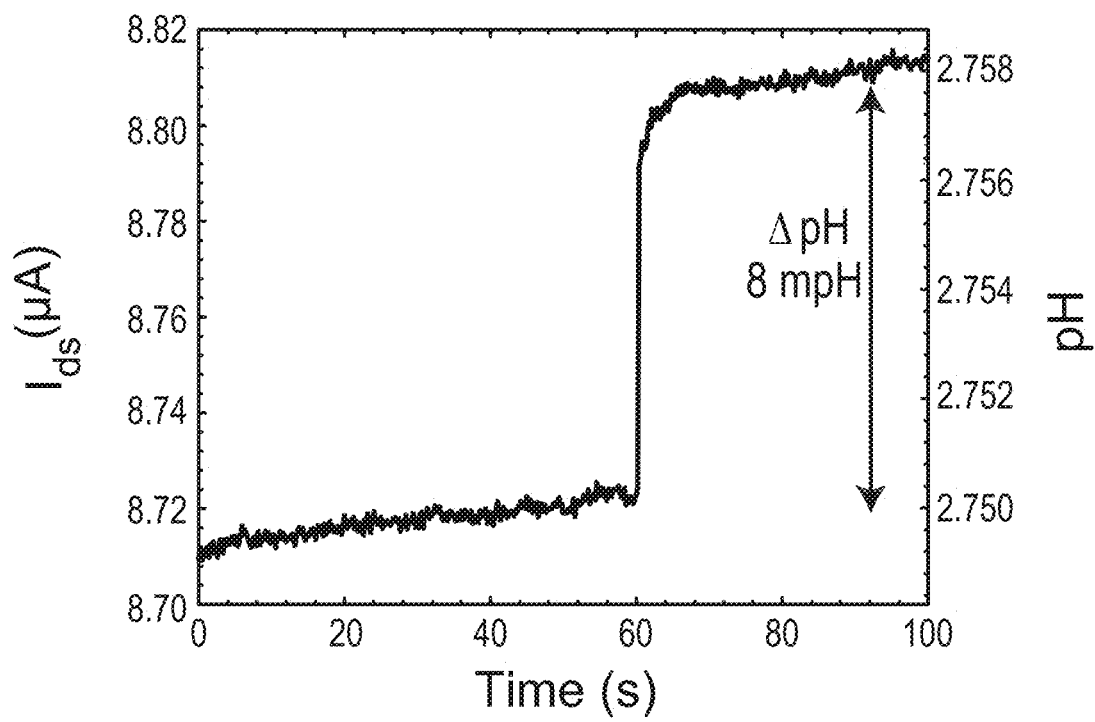
FIG. 5A is a graph showing the change in current $I_{ds}$ over time for the graphene ISFET sensor of FIG. 4B after adding 35 μL of pH 3.22 to 1.2 mL of pH 2.75 at t=60 seconds.
Figure 5B:
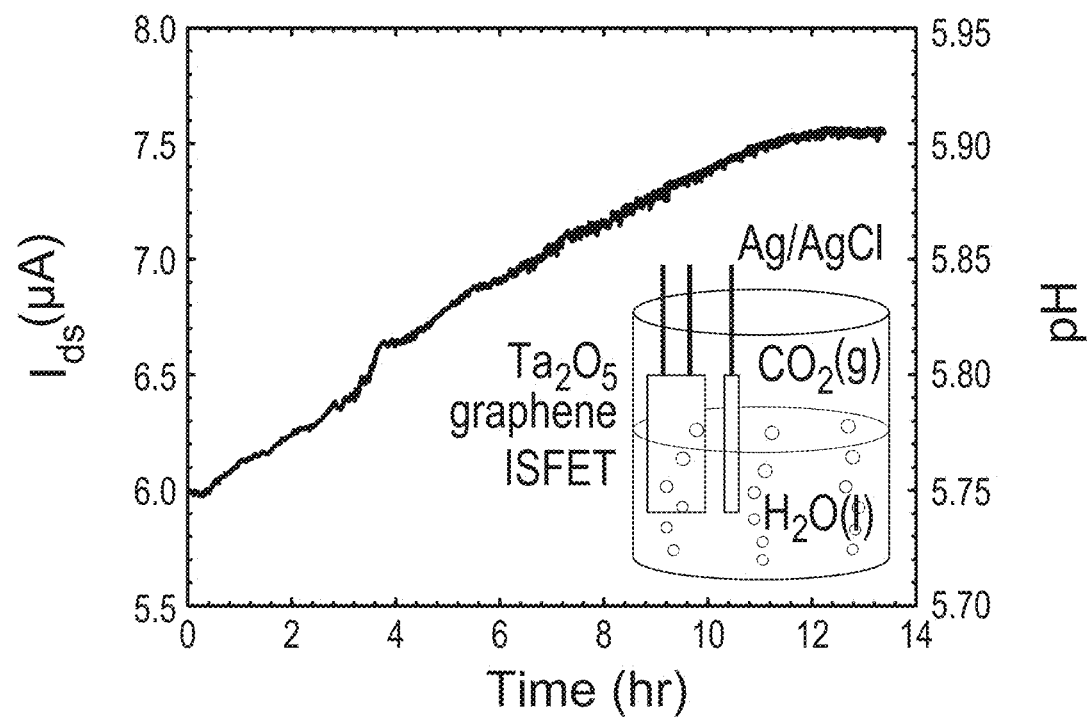
FIG. 5B is a graph showing the change in acidity over time of 1.2 mL carbonated water using the graphene ISFET sensor of FIG. 4A by measuring the change in current $I_{ds}$.

FIG. 5A shows the change in current $I_{ds}$ for a 3 nm Al$_2$O$_3$ ISFET with time after adding 35 μL of pH 3.22 to 1.2 mL of pH 2.75 at t=60 seconds, resulting in 85 nA of change in current for 8 mpH. The root mean square of the noise is ~1 nA. FIG. 5B shows the change in acidity of 1.2 mL carbonated water using a 5 nm Ta$_2$O$_5$ ISFET by measuring the change in current $I_{ds}$ with time. As the carbon dioxide desorbed, $I_{ds}$ increased linearly until the solution settled at pH=5.90 corresponding to 7.55 μA and a response of 10.7 μA/pH.

The significant improvements in gate capacitance and transconductance were achieved with near Nernstian pH response. The real time response of graphene ISFET current $I_{ds}$ to pH changes was observed, including measurement of the root mean square current noise $\sqrt{<i_n^2>}$. A representative measurement for a 3 nm Al$_2$O$_3$ ISFET on quartz, is shown in FIG. 5A. The ISFET analyte was 1.2 mL pH 2.75 solution, and the current $I_{ds}$ was monitored with a 60 Hz electrical bandwidth while $V_{ds}$ and $V_{ref}$ were held constant at 100 mV and 0 mV, respectively. After 60 seconds of measurement, 35 μL of pH 3.22 analyte was added, corresponding to an 8 mpH change, and an instantaneous current change of $i_s=\Delta I_{ds}=85$ nA was observed. This is equivalent to a response of $\delta i_s/\delta pH=10.6$ μA/pH. Similar responses were observed in other graphene ISFETs.

The root mean square noise current was determined from the measured current over a time interval of 60 seconds, giving $\sqrt{<i_n^2>}\sim 1$ nA. The minimum resolvable pH change in these conditions is $\delta pH=\sqrt{<i_n^2>}/(\delta i_s/\delta pH)=0.1$ mpH units, approximately one order of magnitude lower than state of the art pH sensors. The gate referred noise of the graphene ISFETs $\sqrt{<i_n^2>/g_m^2 \Delta f}=4$ μV/$\sqrt{Hz}$, which is greater than the Johnson noise limit of 6 nV/$\sqrt{Hz}$ for our channel resistance of 2 kΩ. Similar values for gate referred noise were observed for graphene transistors with much smaller areas (~10 μm×20 μm), despite 1/f noise being inversely proportional to the graphene area. This can be understood as arising from the necessarily large active site density $N_0 \approx \beta_{int}$ required for pH sensing, in contrast with pristine graphene devices used for potentiometry. Increasing the area of an ISFET will decrease the noise significantly, and therein lies an advantage of large-area graphene.

Lastly, the ISFET sensors were used for measuring the evolution of pH in carbonated water in real time over a duration of 13 hours. The analyte was 1.2 mL of potable carbonated water with pH=5.75. A 5 nm Ta$_2$O$_5$ ISFET was used, and the measured $I_{ds}$ versus time is shown in FIG. 5B as carbon dioxide desorbs from the water. After approximately 11 hours, the solution settles to a new pH. The current change $\Delta I_{ds}=1.60$ μA over this interval corresponds to a final pH=5.90, with a current sensitivity $\delta i_s/\delta pH=10.7$ μA/pH. Over a time interval of several hours, temperature stability itself is an important factor because the pH response is directly proportional to the temperature of the analyte, $\varphi_0/\delta pH \propto T$.

It was found that, in the context of a graphene-based sensor, a parylene layer coating the graphene layer can impart stability to the graphene layer, protect it from degradation and act as a seeding layer for the metal oxide deposition. With only 3 nm of Al$_2$O$_3$ or Ta$_2$O$_5$ required to achieve near Nernstian sensitivities, the detection limit has been reduced to 0.1 mpH units in this specific example. Additional improvement to the detection limit could potentially be further achieved by substituting the parylene with a hydrophobic, chemically inert, 2D insulator such as hexagonal boron nitride. The atomic thinness of 2D insulators will admit gate capacitances even closer to the quantum limit. The approach outlined here could be applied to the problem of sensing the concentration of ionic species other than the proton, through the substitution of appropriately sensitive and selective layers.

Example 2—Potassium and Other Ion Sensing Tests

Figure 6B:
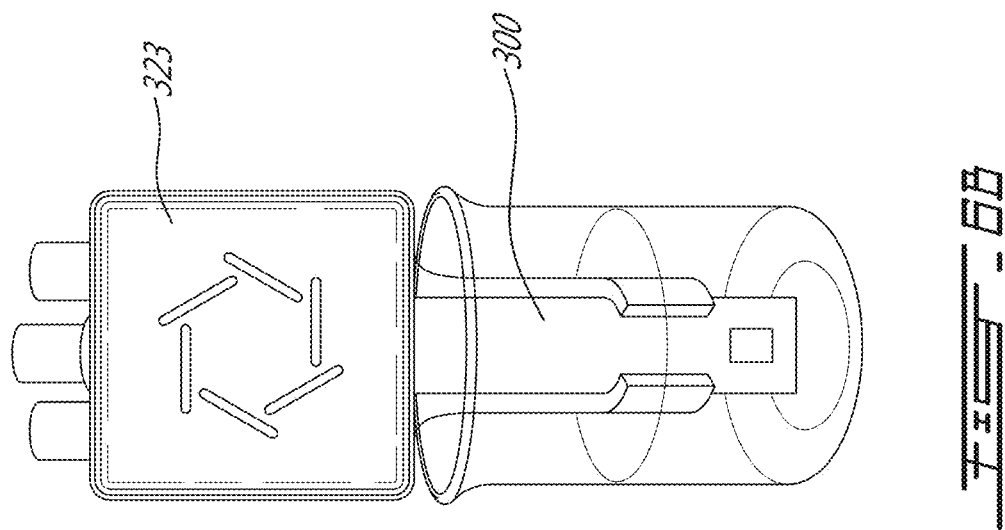
FIG. 6B is an oblique view of the sensor of FIG. 6A, shown immersed in a solution having a potassium concentration, in accordance with an embodiment.
Figure 6A:
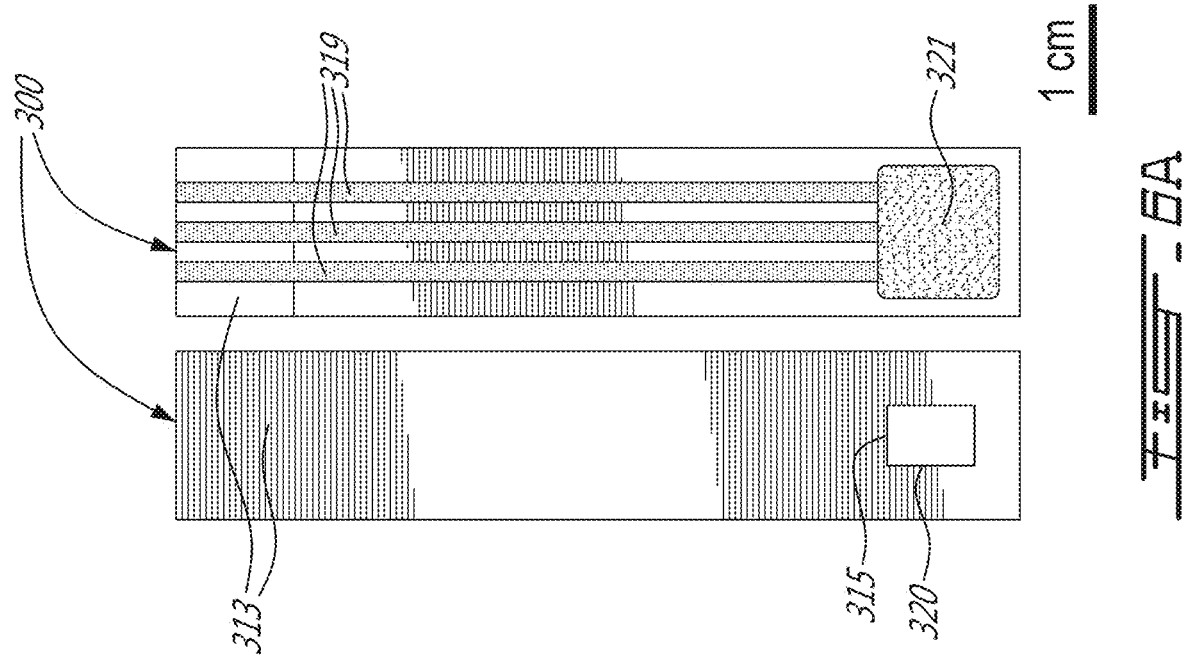
FIG. 6A includes front and rear views of an example of a graphene-based ISFET sensor configured for potassium sensing, shown as part of a printed circuit board, in accordance with an embodiment.

FIG. 6A shows an example of a graphene-based ISFET sensor 300, in accordance with an embodiment. As depicted, the graphene-based ISFET sensor 300 sensor has a substrate having a 300 nm-thick silicon dioxide layer. The substrate has an insulating layer thereon, which is provided in the form of a 115 nm-thick parylene C layer in this example. A graphene layer is deposited in the insulating layer of the substrate and electrical contacts are provided at opposite ends of the graphene layer. In this example, the electrical contacts are made of Ti/Au. Moreover, the graphene-based ISFET sensor 300 has a 10 nm-thick parylene C layer deposited on the graphene layer. A sensing layer 320 coats the 10 nm-thick parylene C layer, opposite the substrate, and extensively covers the electrical contacts in this example. The graphene-based ISFET sensor 300 is configured for sensing potassium concentration. More specifically, in this example, the sensing layer 320 of the graphene-based ISFET sensor 300 is provided in the form of a K$^+$ ionophone membrane.

In this example, the electrical contacts of the graphene-based ISFET sensor 300 are electrically connected to a measurement circuit which is part of a printed circuit board 313 along which conductive traces 319 extend. As can be understood, two of the three conductive traces 319 are connected to the electrical contacts of the sensor 300 (i.e., the drain and the source) whereas the remaining one of the conductive traces 319 is connected to a reference electrode.

As shown, on one side of the printed circuit board 313, the printed circuit board 313 has a sensing opening 315, through which a portion of the sensing layer 320 is sealingly exposed. On the other side of the printed circuit board 313, the electrical contacts and conductive traces 319 are sealed using a sealant material such as epoxy 321. FIG. 6B shows the sensor 300 immersed in a solution having a potassium concentration, ready for measurement as the conductive traces 319 shown in FIG. 6A are electrically and removably connected to a corresponding connector 323.

Figures 8A, 8B:
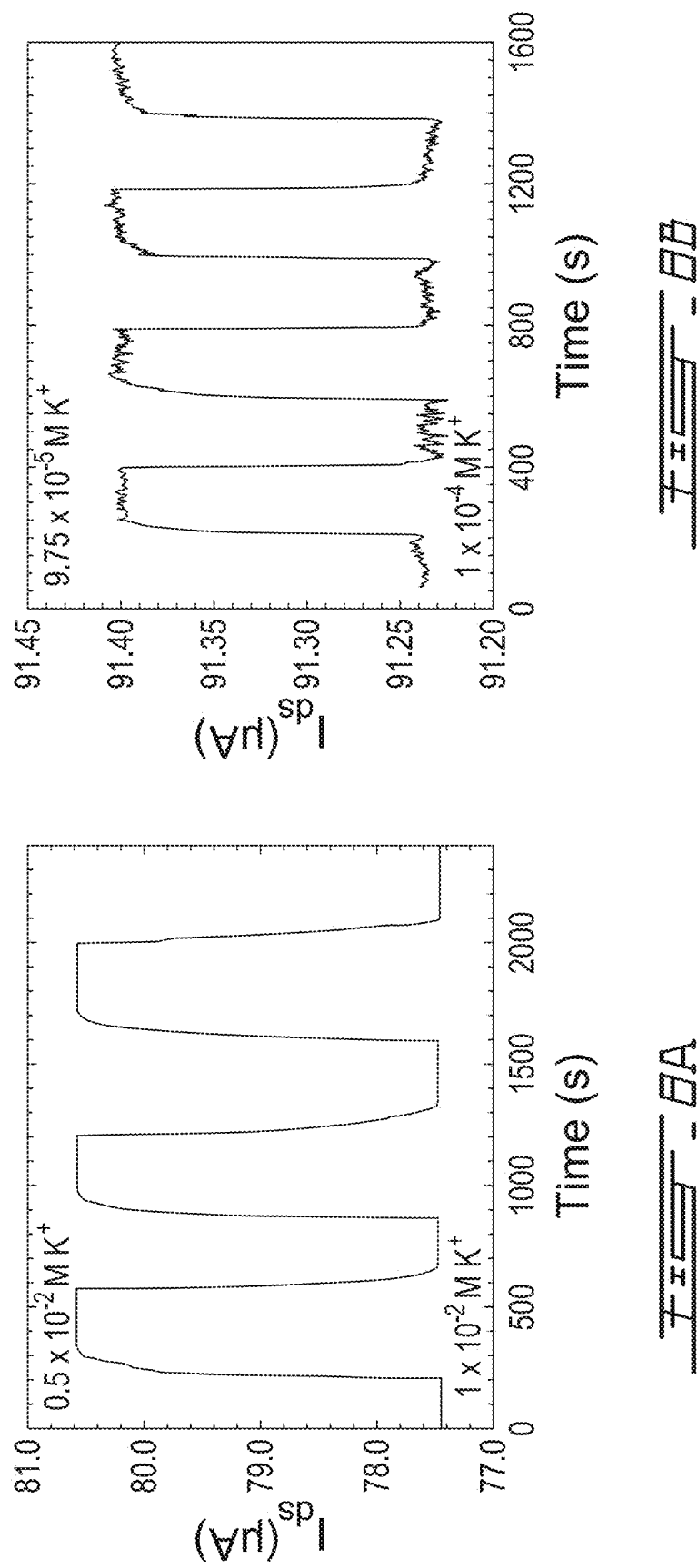
FIG. 8A is a graph showing the change in transistor current $I_{ds}$ as the graphene-based ISFET sensor of FIG. 6A is alternatingly immersed in solutions having potassium concentrations varying between $10^{-2}$ M and $0.5 \times 10^{-2}$ M.
FIG. 8B is a graph showing the change in transistor current $I_{ds}$ as the graphene-based ISFET sensor of FIG. 6A is alternatingly immersed in solutions having potassium concentrations varying between $10^{-4}$ M and $9.75 \times 10^{-5}$ M.

As seen with FIG. 7A, the device was tested for different K$^+$ concentrations, from 10$^{-8}$ M up to 10$^{-1}$ M, and while applying constant source and drain voltages, the current through the graphene layer was monitored at different reference voltages. FIG. 7B shows that the neutrality point $V_{np}$ shifts linearly with K$^+$ concentrations. As shown in FIG. 7C, the current through the graphene layer was also monitored at constant reference, source and drain voltages for the different K$^+$ concentrations, and it changes linearly with changes in molar concentrations down to 10$^{-9}$ M which is equivalent to 39 ng/L. The change in current is 6.58 μA per decade of molar concentration as shown in FIG. 7D. With a root-mean-square (RMS) current noise of 5 nA (shown in FIGS. 8A-B), the detection limit of the sensor is 1 mpK$^+$.

Similar tests were also done for the purpose of sensing Cl$^-$ and NH$_4^+$, with their respective ionophore membranes.

As can be understood, the examples described above and illustrated are intended to be exemplary only. For instance, although printed circuit boards have been described in reference to the illustrated embodiments, the measurement circuit can be part of any suitable type of printed circuit including, but not limited to, flexible printed circuits and the like. The scope is indicated by the appended claims.

What is claimed is:

1. A sensor for sensing a variable of a sample, the sensor comprising:
   a graphene layer supported by a substrate;
   a parylene layer coating the graphene layer opposite the substrate;
   a sensing layer coating the parylene layer opposite the substrate, and being exposable to the sample; and
   electrical contacts at opposite ends of the graphene layer;
   wherein the sensing layer is made of one material of the group consisting of: $Ta_2O_5$ and $Al_2O_3$.

2. The sensor of claim 1 wherein the parylene layer has a thickness sufficient for protecting the graphene layer without impeding ion sensitivity of the graphene layer.

3. The sensor of claim 1 wherein the parylene layer has a thickness between 2 and 20 nm.

4. The sensor of claim 3 wherein the parylene layer has a thickness between 2 and 10 nm.

5. The sensor of claim 4 wherein the parylene layer has a thickness between 4 and 8 nm.

6. The sensor of claim 1 wherein the substrate has an insulating layer supporting the graphene layer.

7. The sensor of claim 6 wherein the insulating layer has a parylene layer.

8. The sensor of claim 7 wherein the parylene layer of the insulating layer has a thickness between 50 nm and 200 nm.

9. The sensor of claim 8 wherein the parylene layer of the insulating layer has a thickness between 75 and 150 nm.

10. The sensor of claim 9 wherein the parylene layer of the insulating layer has a thickness of about 100 nm.

11. The sensor of claim 1 further comprising a measurement circuit connected to the electrical contacts of the graphene layer.

12. The sensor of claim 11 wherein at least a portion of said measurement circuit is part of a printed circuit having a sensing opening, at least a portion of said sensing layer being sealingly exposed via said sensing opening of said printed circuit.

13. The sensor of claim 1, wherein the sensing layer is configured for sensing pH of a sample in contact with said sensing layer.

14. The sensor of claim 1 wherein the sample is provided in the form of a solution, the sensor being configured for sensing an ion concentration in the solution.

15. Use of the sensor of claim 1 as an ion-sensitive field-effect transistor (ISFET) for measuring ion concentrations in the sample.

16. A method of fabricating a sensor, the method comprising:
    depositing a graphene layer on a substrate;
    depositing electrical contacts at opposite ends of said graphene layer;
    depositing a parylene layer on said graphene layer, opposite said substrate, for coating said graphene layer; and
    depositing a sensing layer on said parylene layer, opposite said graphene layer, for coating said parylene layer. the sensing layer being made of one material of the group consisting of: $Ta_2O_5$ and $Al_2O_3$.

17. The method of claim 16 wherein said parylene layer has a thickness sufficient for protecting the graphene layer without impeding ion sensitivity of the graphene layer, said parylene layer having a thickness between 2 and 20 nm, preferably between 2 and 10 nm, and most preferably between 4 and 8 nm.

18. The method of claim 16 wherein said substrate has an insulating layer on said substrate, said depositing said graphene layer on said substrate comprising depositing said graphene layer on said insulating layer of said substrate.

19. The method of claim 16 further comprising electrically connecting said electrical contacts to a printed circuit having a sensing opening for contact with a sample, at least a portion of said sensing layer being exposed via said sensing opening of said printed circuit, the method further comprising sealing said sensing opening of said printed circuit to prevent fluid intrusion.

* * * * *